United States Patent [19] [11] Patent Number: 5,706,215
Woolley et al. [45] Date of Patent: Jan. 6, 1998

[54] METHOD AND SYSTEM FOR ADJUSTING REPLACEMENT COMPONENT CHARACTERISTICS

[75] Inventors: Bradford Gillette Woolley, Palo Alto; Charles Leland Garner, San Carlos; Willis McNeill, San Jose; G. Lindgren, Palo Alto, all of Calif.

[73] Assignee: Harris Corporation, Melbourne, Fla.

[21] Appl. No.: 497,074

[22] Filed: Jun. 30, 1995

[51] Int. Cl.$^6$ .................................................. G06K 7/00
[52] U.S. Cl. .............................. 364/571.01; 364/424.04
[58] Field of Search ................. 364/571.01, 424.039, 364/424.034, 424.038, 424.04, 425, 571.03, 571.02, 571.04, 571.05, 571.06, 571.07, 571.08; 73/116

[56] References Cited

U.S. PATENT DOCUMENTS

| | | | |
|---|---|---|---|
| 4,418,392 | 11/1983 | Hata | 364/571 |
| 4,845,649 | 7/1989 | Eckardt et al. | 364/571.02 |
| 4,947,355 | 8/1990 | Koeman | 364/571.01 |
| 5,008,843 | 4/1991 | Poelsler et al. | 364/571.02 |
| 5,019,980 | 5/1991 | Starr et al. | 364/424.04 |
| 5,089,979 | 2/1992 | McEachern et al. | 364/571.04 |
| 5,184,297 | 2/1993 | Graber et al. | 364/424.05 |
| 5,270,931 | 12/1993 | Appleford | 364/424.01 |
| 5,278,759 | 1/1994 | Berra et al. | 364/424.01 |
| 5,319,962 | 6/1994 | Kaminski et al. | 73/116 |
| 5,337,260 | 8/1994 | Spangler | 364/571.02 |
| 5,371,487 | 12/1994 | Hoffman et al. | 340/425.5 |
| 5,377,128 | 12/1994 | McBean | 364/571.04 |
| 5,394,327 | 2/1995 | Simon et al. | 364/424.01 |
| 5,446,655 | 8/1995 | Adrian et al. | 364/431.04 |
| 5,461,569 | 10/1995 | Hara et al. | 364/431.03 |
| 5,491,631 | 2/1996 | Shirane et al. | 364/424.03 |
| 5,524,078 | 6/1996 | Kolb et al. | 364/424.03 |
| 5,528,519 | 6/1996 | Ohkura et al. | 364/571.04 |
| 5,532,927 | 7/1996 | Pink et al. | 364/424.03 |

Primary Examiner—Kevin J. Teska
Assistant Examiner—Stephen J. Walder, Jr.
Attorney, Agent, or Firm—Rogers & Killeen

[57] ABSTRACT

A method and system for adjusting the gain of an output from a replacement component in a system with plural components responsive to changing operating conditions so that a power level of an output from the system is approximately the same as a power level of an output from the system before installation of the replacement component. A system memory stores a relationship of gain responsive to changing operating conditions for each of plural components in the system, and each replacement component has a component memory for storing a relationship of gain responsive to changing operating conditions. The relationship stored in the component memory is copied to the system memory when the replacement component is installed in the system. A feedback voltage for adjusting the gain of the output from the replacement component is varied in response to the relationships stored in the system memory so that the power level of the output from the system is substantially unchanged by installation of the replacement component.

14 Claims, 1 Drawing Sheet

METHOD AND SYSTEM FOR ADJUSTING REPLACEMENT COMPONENT CHARACTERISTICS

BACKGROUND OF THE INVENTION

The present invention relates to methods and systems for ensuring that a replacement component has operating characteristics that are the same as the component it replaces, and more particularly to an RF communication method and system in which a predetermined power level of an output from the system is automatically maintained when one of the components in the system is replaced.

Complex electronic systems typically include a plurality of components that contribute to the characteristics of an output from the system. When one of the plurality of components fails, it is replaced with a similar component that may or may not make the same contribution to the characteristics to the system output. For example, manufacturing tolerances may allow a replacement component to be sufficiently different so that the output from the system is changed merely by installation of the replacement component. A typical remedy is to manually retune, or otherwise adjust the system or the replacement component to account for this change so that the desired output is restored. As will be appreciated, this extra effort requires time and increases maintenance costs.

By way of example, and with reference to FIG. 1, an RF communication system 10 may include a transmitter 12 that provides a signal to a receiver 14. The received signal is provided through an antenna coupling unit (ACU) 16, a low noise coupler (LNC) 18, and a filter or intermediate frequency amplifier (IFAmp) 20, in order to provide an output that has a predetermined power level that is set for the particular system and is desirably held constant. In such systems it is desirable to be able to determine the transmission loss (TL) between the transmitter 12 and receiver 14, and TL may be determined if other factors are known. If the predetermined power level is −8 dBm, the relationship of the components of FIG. 1 may be expressed as:

$$TL(dBm) - LOSS_{ACU} + Gain_{LNC} + Gain_{IFAmp} = -8 \text{ dBm} \quad (1)$$

that may be restated:

$$TL(dBm) = LOSS_{ACU} - Gain_{LNC} - Gain_{IFAmp} - 8 \text{ dBm} \quad (2)$$

where the ACU loss is known and generally stable, and the gains of the low noise coupler and the IF amplifier are also known, but will vary with temperature and frequency as a function of feedback voltage. That is, a particular feedback voltage provides a particular gain for each temperature and frequency. The relationship of gain to temperature and frequency as a function of feedback voltage for a component may be determined by testing. Thus, the elements of the right side of equation (2) may be determined for a particular system for various temperatures and frequencies.

A problem arises when a component, such as the LNC or the IFAmp, fails and must be replaced. The replacement component will quite likely have a different response to temperature and frequency as a function of feedback voltage than the component it replaces, and thus will provide a different gain for a particular feedback voltage, and an inaccurate TL from equation (2). Manual adjustments are desirably avoided, and it is an object of the present invention to obviate the need for such efforts.

Various methods and devices have been proposed to automatically account for differences among components, but none adjust the operating characteristics of a replacement component so that its performance emulates that of the replaced component. Prior art systems typically automatically adjust the system output, rather than that of the replacement component.

However, adjustment of the system output may be less accurate than adjustment of a component's output in multiple component systems where there is a dependent relationship among the components because a system adjustment does not account for the changes in other components caused by the inaccurate output from the component. See, for example, U.S. Pat. No. 5,089,979 to McEachern, et al. and U.S. Pat. No. 5,184,297 to Graber, et al. in which tables of data provide correction factors that adjust system output.

Accordingly it is an object of the present invention to provide a novel method and system for adjusting replacement component operating characteristics that obviates the problems of the prior art.

It is another object of the present invention to provide a novel method and system for maintaining a predetermined output from a system with multiple components in which an output from a replacement component is adjusted to be the same as that of the component it replaces.

It is still another object of the present invention to provide a novel method and system for maintaining a predetermined output from a system with multiple components in which a system memory stores the operating characteristics of both an original and a replacement component so that an output from a replacement component may be adjusted to be match that of the original component.

It is yet another object of the present invention to provide a novel method and system for adjusting an output from a replacement component in which the replacement component operating characteristics are copied from a replacement component memory to a system memory so that a control signal for operating the replacement component may be adjusted to emulate the operating characteristics of the replaced component.

It is a further object of the present invention to provide a novel method and system in which a feedback voltage that controls the gain of a replacement component in an RF communication system is adjusted so that the gain of the replacement component has the same relationship to changing operating conditions as that of the replaced component.

It is still a further object of the present invention to provide a novel method and system for adjusting a feedback voltage in response to temperature and frequency changes to control the gain of a replacement component in an RF communication system so that power level of the system is not affected by installation of the replacement component regardless of the temperature and frequency.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 2:
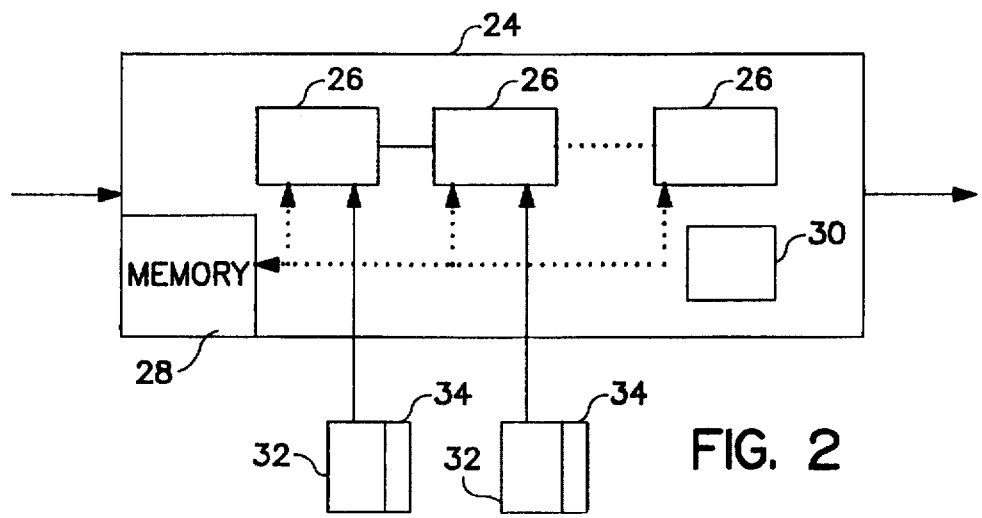
FIG. 2 is a block diagram of an embodiment of the present invention.

With reference now to FIG. 2, in an embodiment of the present invention in a system 24 with a plurality of interactive components 26 and a system memory 28, the operating characteristics of each of the plurality of components 26 may be stored in system memory 28 (system 24 may include other components 30 not considered here). Replacement components 32 may be provided for components 26, each with a component memory 34 for storing its respective operating characteristics. When one of the plurality of components 26 is replaced with a replacement component 32, the operating characteristics of the replacement component 32 from component memory 34 may be provided to system memory 28 for storage. When system 24 is operating with replacement component 32 installed, a control signal that operates replacement component 32 responsive to the operating characteristics of replacement component 32 is adjusted so that the operating characteristics of replacement component 32 approximate those of replaced component 26.

Figure 3A:
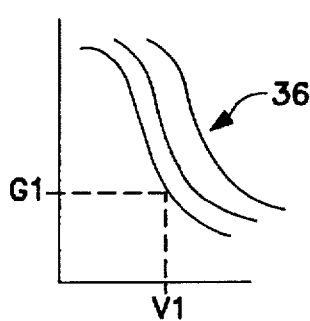
FIGS. 3a–b are graphs illustrating the operating characteristics of an original component (3a) and a replacement component (3b).
Figure 3B:
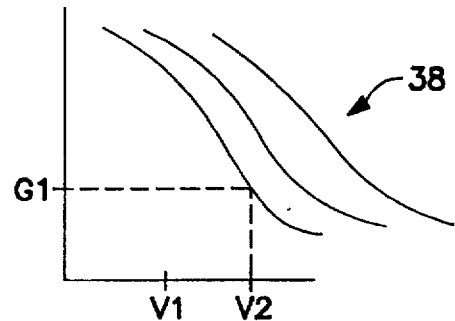

By way of further explanation, and with reference to FIG. 3a–b, system memory 28 stores the operating characteristics of a component 26, such as depicted in FIG. 3a. As shown therein, a particular control signal V1 may provide a particular output G1 for a particular set of operating conditions, and the relationship of V1 to G1 may be depicted by curve 36. A family of curves 36 may be provided for operating conditions to which G1 is particularly sensitive. Component memory 34 stores the operating characteristics of a replacement component 32, such as depicted in FIG. 3b, and the relationship between a control signal and an output may be depicted by family of curves 38. This relationship is copied or transferred for storage in system memory 28 when replacement component 32 is installed. As shown in FIG. 3b, a different control signal V2 may be need to provide output G1 for a particular set of operating conditions. Because output G1 is desirably maintained after replacement component 32 has been installed, system memory 28 adjusts the control signal provided to replacement component 32 to V2 so that output G1 is provided. The curves 36 and 38 may be stored in any convenient format, such as a polynomial equation that has been fit to test results.

Figure 1:
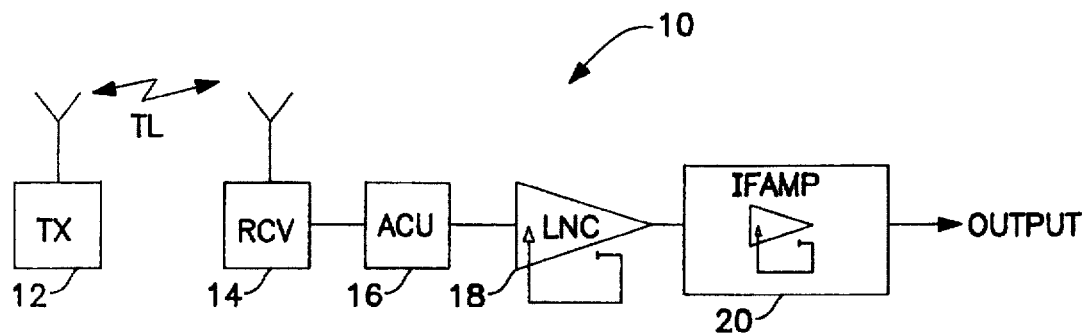
FIG. 1 is a block diagram of an communication system of the prior art.

In a preferred embodiment, the present invention finds application in the communication system of FIG. 1. The system memory 28 may be a nonvolatile memory, such as EEPROM, and may store the curves 36 for the LNC 18 and the IFAmp 20, where G1 is component gain and V1 is feedback voltage used to control the gain of the component. The family of curves 36 may be for various frequencies and temperatures at which the component may operate. The system memory 28 may be conventionally connected to the LNC 18 and IFAmp 20 to control feedback voltage for each.

The family of curves 36 may be derived from test results using conventional curve fitting techniques, such as least squares. For example, with temperature held constant, the affect of frequency on gain may determined for a range of feedback voltages. Several different polynomial equations suitable for different ranges of feedback voltage may be fit together to provide curves of sufficient accuracy. Thereafter, the tests may be repeated for different temperatures, or a general temperature relationship may be used to provide the relationship of gain to temperature and frequency as a function of feedback voltage within the appropriate ranges (the temperature correction is usually small and the accuracy provided by a general correction may be sufficient). The coefficients of the equations may be stored and the equations solved conventionally. The family of curves 38 may be similarly derived.

For the embodiment of the invention applicable to a communication system such as in FIG. 1, the family of curves for the LNC 18 may include (1) a family of feedback voltage versus gain curves for selected frequencies, (2) a plot of gain error at selected temperatures (e.g., the expected extremes of device operation), and (3) a plot of gain correction versus frequency at several feedback voltages for curve fitting when the frequency is between the selected frequencies. In operation, the gain for a particular voltage is determined for a predetermined temperature and frequency using plot (1), and the result corrected to the measured temperature by linear interpolation of plot (2). Thereafter, the gain is corrected to the measured frequency by using plot (3). The procedure for the IFAmp 20 is similar, except the result is not frequency dependent.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. In a system having a plurality of interactive components and a memory, a method of adjusting operating characteristics of a replacement component so that the operating characteristics of the replacement component approximate corresponding operating characteristics of a component replaced by the replacement component, the method comprising the steps of:

(a) storing in a system memory operating characteristics of each of a plurality of components;

(b) providing a replacement component with a component memory for storing operating characteristics of the replacement component;

(c) replacing a first one of the plurality of components with the replacement component;

(d) providing the operating characteristics of the replacement component from the component memory to the system memory; and (e) adjusting a control signal for operating the replacement component responsive to the operating characteristics of the replacement component so that the replacement component operating characteristics approximate those of the first one of the components.

2. The method of claim 1 wherein the system is an RF communication system, and wherein the operating characteristics comprise the relationship of gain to frequency and component temperature, and wherein the control signal is a feedback voltage.

3. The method of claim 2 further comprising the step of referring to the operating characteristics of the first of the components and the replacement component stored in the system memory to adjust a feedback voltage for the replacement component so that the relationship of gain to temperature and frequency for the replacement component is same as for the first of the components.

4. The method of claim 3 wherein the first one of the components is one of a low noise coupler and an intermediate frequency amplifier.

5. The method of claim 1 further comprising the step of providing an output of a predetermined power level from the system, and wherein the adjustment of the control signal maintains the predetermined power level when the replacement component is operating in the system.

6. The method of claim 5 wherein the replacement component has a gain that effects the predetermined power level, and further comprising the step of adjusting a feedback voltage in the replacement component so that the gain of the replacement component is the same as a gain of the first one of the components for similar operating characteristics.

7. A method of adjusting a gain of an output from a replacement component in a system with plural components responsive to changing operating conditions so that a power level of an output from the system is approximately the same as a power level of an output from the system before installation of the replacement component, the method comprising the steps of:

(a) storing in a system memory a relationship of gain to changing operating conditions for each of plural components in the system;

(b) providing a replacement component for one of the plural components with a component memory for storing a relationship of gain to changing operating conditions for the replacement component;

(c) providing the relationship stored in the component memory to the system memory when the replacement component is installed in the system; and (d) adjusting a control signal for the replacement component responsive to the relationships stored in the system memory so that the power level of the output from the system is substantially unchanged by installation of the replacement component.

8. A system for adjusting operating characteristics of a replacement component so that the operating characteristics of the replacement component approximate corresponding operating characteristics of a component replaced by the replacement component, the system comprising:

a plurality of interactive components;

a system memory for storing operating characteristics of each of said plurality of components;

a replacement component with a component memory for storing operating characteristics of said replacement component, said replacement component for replacing one of said plurality of components;

means for providing the operating characteristics of said replacement component from said component memory to said system memory when said replacement component replaces one of said plurality of components; and means for adjusting a control signal for operating said replacement component responsive to the operating characteristics of said replacement component so that said replacement component operating characteristics approximate those of the one of said plurality of components replaced by said replacement component.

9. The system of claim 8 wherein the system is an RF communication system, and wherein the operating characteristics comprise the relationship of frequency and component temperature to component gain, and wherein said control signal is a feedback voltage.

10. The system of claim 9 wherein said plurality of components comprise at least one of a low noise coupler and an intermediate frequency amplifier.

11. An RF communication system for receiving an RF signal and converting the received signal to an intermediate frequency at a predetermined power level, the system comprising:

a low noise coupler and an intermediate frequency amplifier connected in series, each having a gain that is responsive to a feedback voltage and which affects the predetermined power level;

a system memory for storing a relationship of gain to an operating condition as a function of feedback voltage for each of said low noise coupler and said intermediate frequency amplifier;

a replacement component with a component memory for storing a relationship of gain to an operating condition as a function of feedback voltage of said replacement component, said replacement component for replacing one of said low noise coupler and said intermediate frequency amplifier;

means for providing said relationship stored in said component memory to said system memory when said replacement component is installed in the system; and means for adjusting the feedback voltage for said replacement component responsive to said relationships stored in said system memory so that the predetermined power level is substantially unchanged by installation of said replacement component.

12. The system of claim 11 wherein said system memory stores the relationship of temperature to gain for said low noise coupler and an intermediate frequency amplifier.

13. The system of claim 12 wherein said component memory stores the relationship of temperature to gain for said replacement component.

14. The system of claim 11 wherein said system memory stores the relationship of frequency to gain for said low noise coupler, and wherein said component memory stores the relationship of frequency to gain for said replacement component that is to replace said low noise coupler.

\* \* \* \* \*